United States Patent [19]

Henley, III

[11] 4,028,107

[45] June 7, 1977

[54] PROCESS AND APPARATUS FOR PRODUCING PRINTED MATTER

[76] Inventor: John C. Henley, III, 2345 Crest Road, Birmingham, Ala. 35223

[22] Filed: May 19, 1971

[21] Appl. No.: 144,885

[52] U.S. Cl. .............................. 96/41; 40/158 B; 96/33; 101/DIG. 12; 355/75; 355/82; 355/127; 355/132
[51] Int. Cl.² ...................... G09F 1/10; G03C 5/04
[58] Field of Search ............... 101/DIG. 12; 40/2.2, 40/158 B; 96/33, 36.3, 41; 355/132, 72, 73, 75, 76, 82, 114, 122, 127

[56] References Cited

UNITED STATES PATENTS

| | | | |
|---|---|---|---|
| 1,679,942 | 8/1928 | Newton | 355/132 |
| 2,556,144 | 6/1951 | Newman | 101/451 |
| 2,659,282 | 11/1953 | Freund | 101/DIG. 12 |
| 2,902,770 | 9/1959 | Mulcahy | 101/DIG. 12 |
| 3,000,737 | 9/1961 | Barnhart | 101/DIG. 12 |

FOREIGN PATENTS OR APPLICATIONS 1,105,327  3/1968  United Kingdom ................ 355/95

Primary Examiner—Clyde I. Coughenour
Attorney, Agent, or Firm—Jennings, Carter & Thompson

[57] ABSTRACT

Process and apparatus for printing a plurality of imposed pages in which proofs of said pages are manufactured, the proofs then being confined in co-planar, predetermined relation by engaging the sheets solely along selected edges thereof, and while holding the sheets thus confined manufacturing a printing plate or other reproductions therefrom. In one embodiment the proofs are on opaque or light impermeable sheets, while in a second embodiment they are on light permeable sheets. In the case of the opaque proofs used to make a printing plate, the plate is produced from a photo negative of the proof, whereas if the proofs are on light permeable material a plate may be produced directly by passing light through said proofs onto the sensitized surface of the plate material.

4 Claims, 5 Drawing Figures

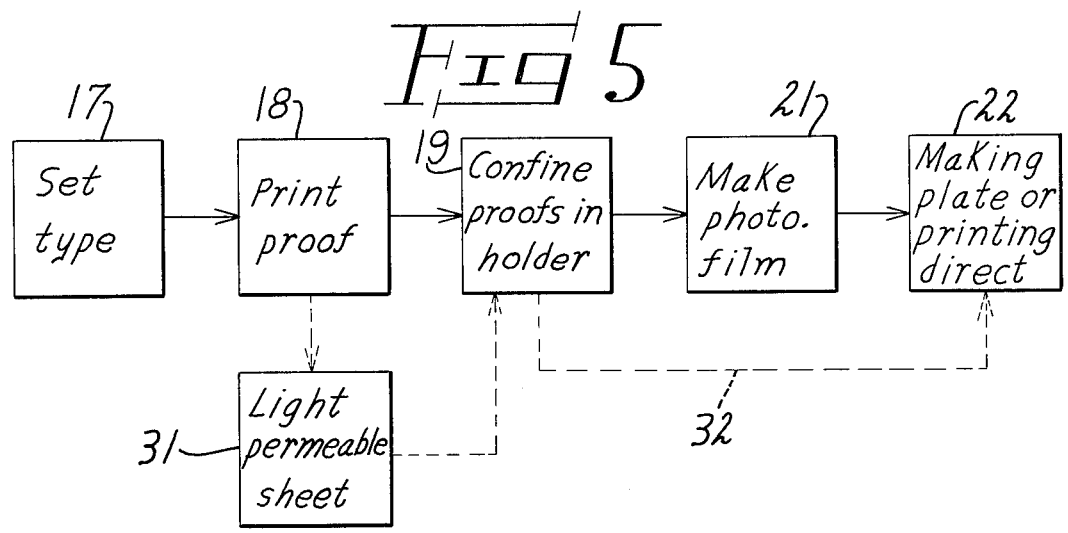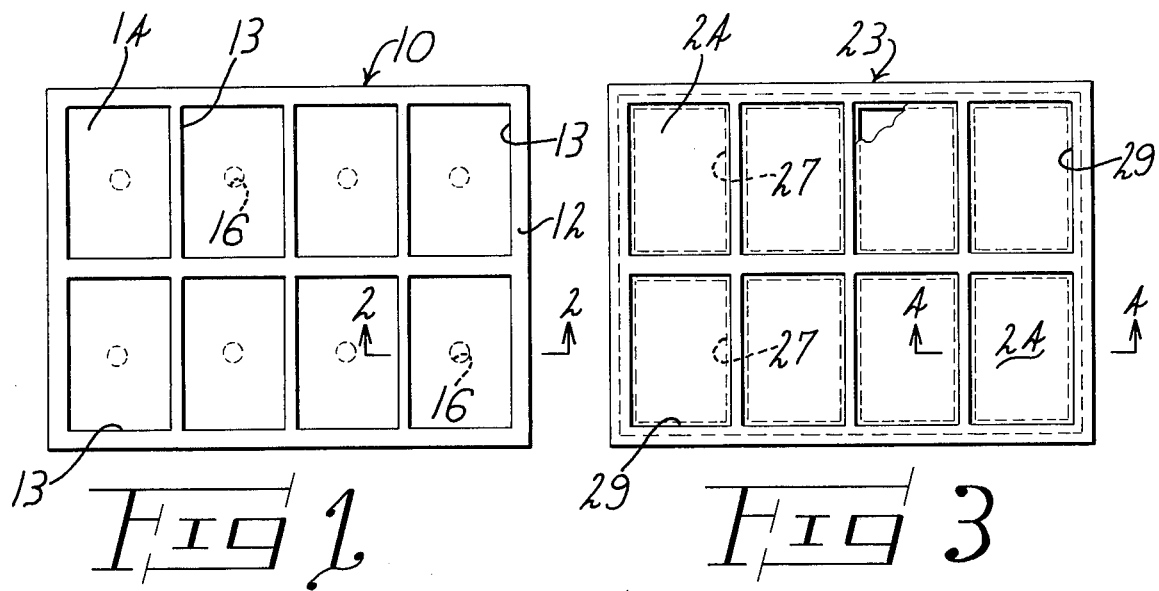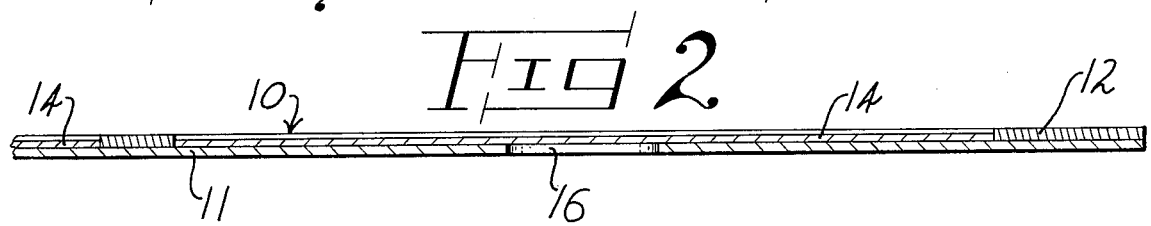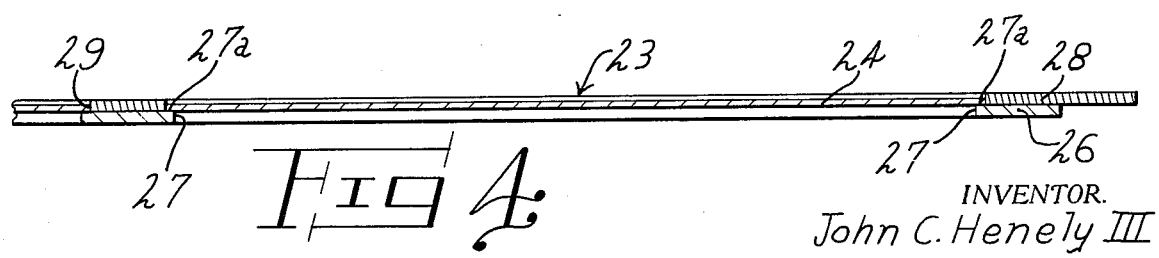

PROCESS AND APPARATUS FOR PRODUCING PRINTED MATTER

My invention relates to the production of printed matter from a plurality of imposed pages or proofs in a more facile and economical manner than heretofore known.

In the art to which my invention relates, the manufacture of books, multi-page brochures, etc., requires a considerable amount of tedious hand labor to prepare for production of printing plates. Heretofore and by way of example, the first step generally is to produce from type proofs of the pages on sheets of paper. The sheets are then individually carefully cut, pasted, spaced, aligned and arranged in proper order on a backing or support sheet, all these steps generally being called "paste up". The thus prepared composite is then photographed, producing a photographic film. Usually the next step, called "stripping" seeks correctly to align the film on a piece of masking paper. The operator now cuts out the area of the masking paper through which the light is to pass. He now aligns the thus prepared sheet, commonly known as a "flat" with a sensitized plate and exposes it to light, thus to produce the printing plate. As heretofore practiced, in those cases where the job was to be printed again at a later date but with various changes in the text it sometimes was the practice to store the set type with the idea that certain lines only could be re-set, thus to make the required changes in the subsequent edition of the work. Such practice is wasteful of storage space, requires considerable cataloging and physical arrangement of and handling the type, and otherwise is quite cumbersome.

My invention contemplates a process and apparatus for carrying out the same which eliminates many of the above difficulties. First, in accordance with one modification of my invention I manufacture on fairly heavy, accurately dimensioned sheet or board a proof of each page of the work. This may be done on a standard reproduction proof press, it being quite feasible properly to position the subject matter on the sheets so that all sheets are equally and properly margined, all around. Using the proofs just produced, I now place them in proper order in my improved, accurately formed holder. The holder is made of material having a thickness within a fraction of an inch of the thickness of the proof sheets and in such manner that the proofs are confined solely along the edges, or selected ones of the edges. If desired the printing may now be done by any of the well known printing processes such as xerography. However, if printing is to be done from a plate, by photography I make a film negative of the composite group of proofs, while in said holder, and while confined as aforesaid. The sheet of film is accurately positioned during exposure so as to precisely orient the subject matter to the edges of the film. The film is now carefully oriented relative to a sensitized plate whereby through "burning" and developing I produce a printing plate. The printing plate is now used to manufacture the group of pages of the work which may be folded and cut or trimmed resulting in the printed sheets being in proper sequence relative to each other. The proofs are preserved so that if on the next printing changes are desired these may be accomplished by cutting from the sheets entire lines, paragraphs, or sections, in my improved holder. The thus prepared "new" or revised proof is now ready for use in the process as already described.

A second modification of my invention contemplates printing or photographically reproducing the subject matter directly on sheets of light permeable material and to place these in proper relation in my improved holder where they are confined solely around the edges, or selected edges. Such composite group of proofs or film now is accurately related to a sensitized plate to produce a printing plate.

With either modification of my invention I eliminate the necessity of having an artist "paste up" the individual proofs. Further, I eliminate the stripping operation now presently in general use throughout the industry.

In view of the foregoing my invention contemplates a process fully capable of economically and easily obtaining quality, multiple page, accurately related printed matter.

Another object is to provide a process of the character designated in which corrections or substitution of matter on the pages of a set of proofs may be easily and accurately made, whereby, for the purpose of printing other editions the proofs may be preserved in lieu of storing type itself.

Another object is to provide a multiple page holder which is used accurately to align and space the proofs, whether printed on heavy board or paper or on relatively thin material such as acetate film, so constructed as to confine the proofs solely around the edges, or selected edges, thereby to maintain alignment and spacing of the proofs, whether these are the original proofs or are proofs into which new sections, portions and the like have been fitted as aforesaid.

Apparatus illustrating features of my invention and which may be used in carrying out my improved process is illustrated in the accompanying drawings forming a part of this application in which:

FIG. 1 is a plan view of a holder which may be used to hold for photographing a plurality of proofs printed on relatively heavy board or paper;

FIG. 2 is a sectional view taken generally along line 2—2 of FIG. 1, and greatly enlarged, illustrating the confinement of a proof within one of the compartments of the holder;

FIG. 3 is a plan view of a holder especially adapted for holding relatively thin proofs such as those which may be printed on light permeable material such as acetate, a portion of the view being broken away;

FIG. 4 is an enlarged detail sectional view taken generally along line 4—4 of FIG. 3 and illustrating the confinement of the proofs in the holder of FIG. 3, in which case a printing plate may be manufactured directly from such proofs; and, FIG. 5 is a diagram showing the sequence of steps preferably used in carrying out my improved process.

Referring now to the drawings for a better understanding of my invention, in FIGS. 1 and 2 I illustrate one form of holder 10 which may be made up of a backing or support sheet 11. On the face of the backing or supporting sheet 11 I provide a sheet 12 which has a plurality of accurately spaced, accurately dimensioned cut outs or openings therein. The openings 13 are accurately formed to receive a plurality of equally accurately cut sheets 14 on which the printed matter of the various pages has been printed as from type in a reproduction proof press. For convenience, holes 16 may be provided in the backing sheet 11 so that the proofs may be pushed out of the frame more easily.

It will be understood that the proofs 14 may be manufactured on sheets of relatively heavy paper, board or the like. In any event, each sheet represents heavy paper, board or the like. In any event, each sheet represents one page of a multi-page work and the sheets are put in the holder in such order, page-wise that when the entire composite group is reproduced photographically, and then a plate made therefrom, the resulting pages printed from the plate when cut and folded in standard manner lie in the proper sequence in the book. Also, the thickness of the sheet 12 closely approaches that of the proof sheets 14 and in no event is its thickness greater than a fraction of an inch more than the thickness of the proof sheets.

Referring to FIG. 5 for the moment it will be seen that the first step in the process indicated by the block 17 is to set the type for the matter to appear on each of the proofs 14. In the case of the opaque proofs the next step is to print the actual proof 14 as indicated by the block 18. In this proofing the subject matter is accurately located relative to the edges of the sheet. Next, as shown in block 19 the proofs 14 are confined in the holder 10 as illustrated in FIGS. 1 and 2. The next step as shown in block 21 is to photograph the composite group of proofs while held in the holder 10, thus to produce a photographic negative of the entire composite group of the same. And finally, the photographic negative produced above is used to "burn" a sensitized plate, thus to produce a printing plate which may be used for production of a sheet containing all of the pages in the holder 10 as shown on the film. Furthermore, due to the accurate placement of the subject matter on the negative and in turn the accurate positioning of the negative relative to the plate, each page is produced with proper margins and in predetermined sequences.

From the foregoing it will be apparent that by the provision of the holder 10 having the compartments 13 therein accurately dimensioned and accurately spaced relative to each other, and through the use of accurately dimensioned proof sheets 14, I eliminate the "paste up" process heretofore used in preparing such proofs for photographic reproduction. Furthermore, due to the accurate positioning of the openings 13, stripping heretofore used in the art is eliminated. It will also be seen that through the use of a reproduction proof press it is possible accurately to print the subject matter on each of the proofs 14 so that they are accurately margined, all around. Plates produced from the process just described therefore are accurately and quickly done, and all of the steps heretofore performed by an artist in aligning the individual proofs, "pasting up", and so forth, are eliminated by the use of my improved process and holder 10.

In FIGS. 3 and 4 I illustrate a form of holder 23 which may be used to confine along the edges thereof a plurality of proofs 24 which may be light permeable, such as sheets of acetate on which the matter to be reproduced on the plate has been printed, also if desired, by a reproduction proof press. Thus, the holder 23 comprises a backing sheet 26 having relatively large cut outs or openings 27 through the same. Secured to the front surface of the backing sheet 27 is a sheet 28 which has cut outs 29 therein which are slightly larger in every dimension than the cut outs 27. Therefore, when the proofs 24 are put into the openings 29 they are confined all around the peripheral edge portions by the openings 29 and also rest on the peripheral edge portions 27a defining the openings 27. However, the proofs 24 are still held in the frame or holder solely by engagement along the edge surfaces 27a or edges themselves. While I preferably provide the surfaces 27a they are not essential.

Referring now to FIG. 5 it will be seen that starting with the set type, matter to be reproduced on the printing plate is printed on the proofs 24 as indicated by the block 31. These proof sheets are then confined in the holder 23 as indicated by block 19, just as in the case of the proof sheets 14. However, as shown by line 32 the need to reproduce a film photographically is not essential and may be eliminated, inasmuch as the holder carrying the proofs 24 may be positioned directly on the surface of the sensitized plate, where light is passed through the proofs 24 to "burn" the plate. Thus, when secured in the holder 23 the light permeable proofs 24 may be used directly to "burn" the plate.

In view of the foregoing it will be seen that I have devised an improved process and apparatus which is extremely useful in the printing arts. My invention is particularly useful in the production of multi-page works such as books, brochures, catalogs, and the like. Also, in accordance with my invention, if a printing house is manufacturing, for instance, from year to year, or other periods of time, certain books for a customer in the nature of catalogs or the like, any changes in the pages of the books on subsequent printings may easily be made. Even with the transparent or light permeable proof sheets 24, changes may be made by physically cutting across the sheet to take out the old text, and proofing the new text on like sheet material, whereupon the sheet may be reassembled in the holder 23 thus to place therein a page or pages on which the new matter has been inserted for the old.

In practice I have found that three mil acetate, matted on one side, may be used to produce the proofs 24. In addition to acetate I have used a good quality proof paper having uniform density and light transmission qualities. Such materials are adequate from the light transmission standpoint and also have the physical strength to permit sections of the sheet to be cut out and new matter printed on like material substituted in its place.

In actual practice I have found that by using my invention I can reproduce accurate, fine quality work, consistently and predictably.

While I have shown my invention in but two forms, it will be obvious to those skilled in the art that it is not so limited, but is susceptible of various other changes and modifications without departing from the spirit thereof.

What I claim is:

1. The process of printing a plurality of imposed pages comprising:
   a. manufacturing proofs of each page on sheets of material on which the matter to be printed is positioned in predetermined areas thereof,
   b. confining said proof sheets in a co-planar and predetermined relation to each other by engaging the sheets solely along selected ones of the sheet thickness edges thereof, whereby the entire upper surfaces of said sheets are unobstructed, and
   c. simultaneously reproducing on a single surface the subject matter of all of said proof sheets while maintaining them confined and related to each other as set forth in (b) above.

2. The process of claim 1 in which said proofs of each of said pages are printed on sheets of light permeable material, which sheets are confined in said co-planar and predetermined relation to each other as set forth in (b) of claim 1, above, and utilizing said confined sheets to manufacture directly therefrom a printing plate by superimposing said sheets relative to the treated surface of a plate and exposing the same to light, thus preparing the plate for subsequent chemical treatment to produce a printing plate which may be used to reproduce the matter on said sheets.

3. The process of claim 1 including the further step of producing a photographic film of the entire array of said sheets while so confined, and utilizing said film to produce a printing plate.

4. The process of claim 1 in which the said proofs are manufactured on sheets of opaque material, and including the further step of producing photographic film of the entire array of said sheets while so confined, and utilizing said film to produce a printing plate.

* * * * *